United States Patent [19]

Kadonishi

[11] Patent Number: 5,736,453

[45] Date of Patent: Apr. 7, 1998

[54] METHOD FOR DIVIDING PLURAL SEMICONDUCTOR DEVICES FORMED ON SINGLE WAFER INTO INDIVIDUAL SEMICONDUCTOR DEVICES

[75] Inventor: Hiroshi Kadonishi, Kyoto, Japan

[73] Assignee: Rohm Co., Ltd., Kyoto, Japan

[21] Appl. No.: 550,883

[22] Filed: Oct. 31, 1995

[30] Foreign Application Priority Data

Oct. 31, 1994 [JP] Japan .................................. 6-266904

[51] Int. Cl.⁶ ................................................ H01L 21/304
[52] U.S. Cl. ........................................... 438/460; 438/948
[58] Field of Search ............................. 156/645.1, 657.1;
437/226; 438/460, 461, 462, 463, 464,
465, 428, 438, 948

[56] References Cited

U.S. PATENT DOCUMENTS

| 4,729,971 | 3/1988 | Coleman | 437/226 |
| 4,929,300 | 5/1990 | Wesleister | 156/645 |
| 4,935,936 | 6/1990 | Nelson et al. | 372/46 |
| 5,259,925 | 11/1993 | Herrick et al. | 156/659.1 |
| 5,556,735 | 9/1996 | Ivory et al. | 430/315 |

*Primary Examiner*—Kathryn L. Gorgos
*Assistant Examiner*—William T. Leader
*Attorney, Agent, or Firm*—Merchant, Gould, Smith, Edell, Welter & Schmidt, P.A.

[57] ABSTRACT

A method for dividing a plural number of semiconductor devices into individual semiconductor devices to increase the number of chips manufactured per wafer by forming scribing lines in narrow width. Isotropic etching, such as plasma etching in $CF_4$, $O_2$ gas, is carried out by utilizing resist layer 31c to 35a as a mask. Then by carrying out heat treatment the resist layer 31 to 35a loosens, and as a result, side walls of the passivation layer 15 are covered with the resist layer. N type epitaxial layer 4 of the openings 24 and 25 for the scribing line is etched by carrying out isotropic plasma etching once again. Since the side walls of the passivation layer 15 of the openings 24 and 25 for the scribing line are covered with the resist layer, the openings 24 and 25 are not etched in the horizontal direction.

14 Claims, 3 Drawing Sheets

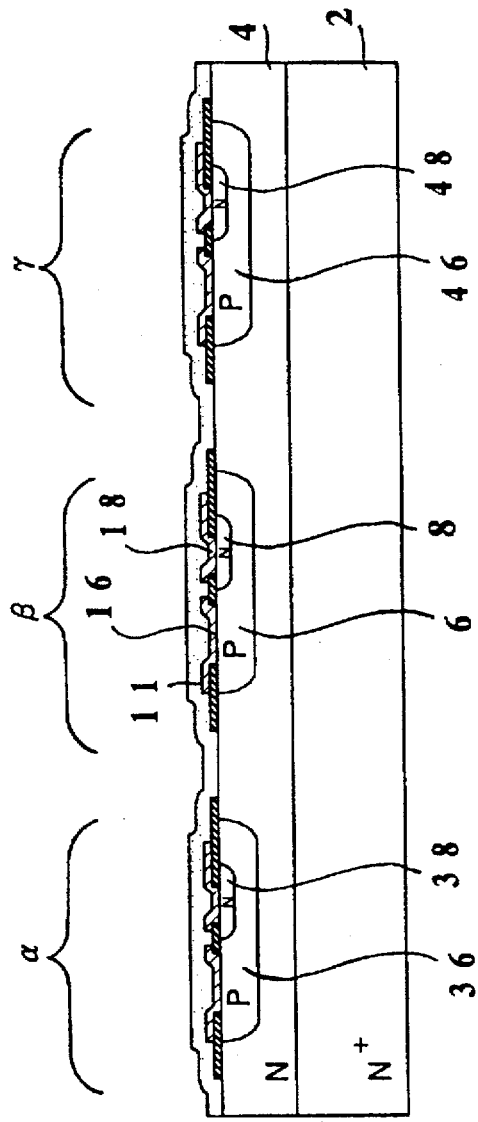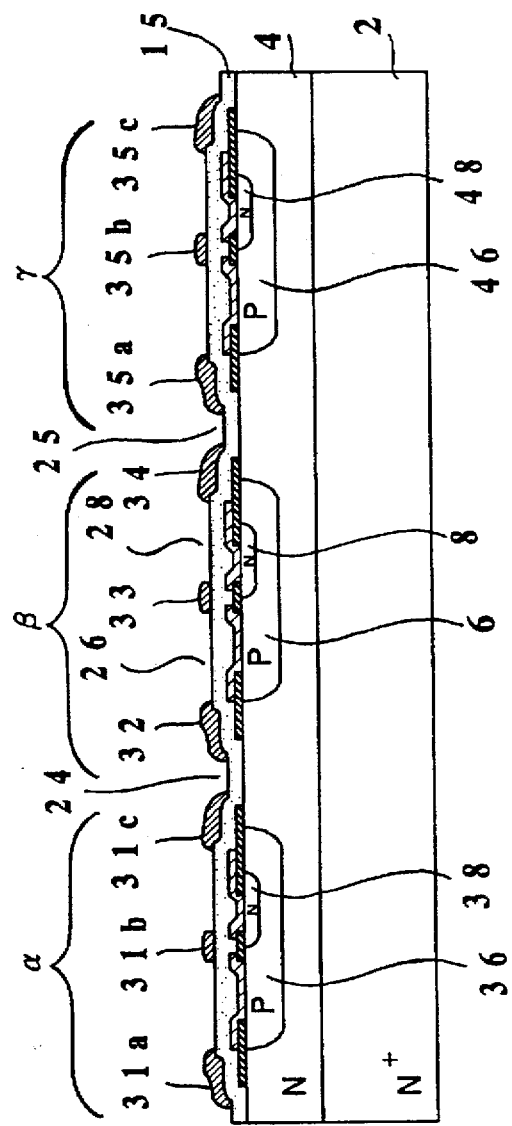
FIG. 2A
FIG. 2B

METHOD FOR DIVIDING PLURAL SEMICONDUCTOR DEVICES FORMED ON SINGLE WAFER INTO INDIVIDUAL SEMICONDUCTOR DEVICES

BACKGROUND OF THE INVENTION

1. Field of the Invention

The present invention relates to a method for dividing semiconductor devices formed on a wafer into individual semiconductor devices by cutting the wafer along a scribing trench, more specifically, a method for forming a scribing trench on a wafer.

2. Description of the Prior Art

In general, semiconductor devices such as a transistor, a diode or the like are formed on a single wafer as a plural number of semiconductor devices. Then the wafer is cut into individual semiconductor devices (chips) using a scribing process. In the scribing process, in the dicing step the wafer is cut using a dicing saw or the like along scribing lines which form boundaries of the chips.

There is a risk of causing a defect (hereinafter referred as chipping) in part of the semiconductor chip(s) during the cutting. To resolve the problem, Japanese laid-open SHO 51-78687 discloses a method for dividing semiconductor devices as shown in FIG. 1.

Upon forming a passivation layer 45 as shown in FIG. 1A, opening 47 is formed where scribing lines will be created for use in cutting during the dicing process. Openings 48 are also formed as shown in FIG. 1B and FIG. 1C. Then, epitaxial layer 43 is etched by plasma etching as shown in FIG. 1D. Thus, a trench is formed in the epitaxial layer 43. Thereafter, dicing is carried out by cutting the wafer along the trench thus formed. In this way, it is possible to prevent the cause of chipping by forming the trench prior to the dicing process.

However, this method for dividing semiconductor devices has the following problems.

Since plasma etching is used in the above method and since it is a kind of isotropic etching, the etching rate of silicon is higher than the etching rate of the passivation layer 45. As a result, etching in the horizontal direction of the epitaxial layer 43 is faster than etching of the passivation layer 45. Thus, the passivation layer 45 is etched in an overhang shape.

In order to prevent forming the passivation layer 45 in the overhang shape, it is possible to do the following. The passivation layer 45 is etched according to a resist pattern. Then the resist is removed. Another resist pattern is formed so that openings thus formed are narrower than the openings previously formed. Thereafter etching is done to form the trench. However, in that way, an extra step for forming resist layers is required. Additionally, the scribing line is formed wider due to alignment-shift which results when the resist is mis-aligned. The width of the scribing line thus formed is wider than the scribing line previously formed, so that the number of semiconductor chips which can be manufactured per wafer is decreased.

SUMMARY OF THE INVENTION

It is an object of the present invention to provide a method for dividing semiconductor devices which solves the above mentioned problems, and to increase the number of semiconductor chips manufactured per wafer without adding many processes.

A method for forming a scribing recess to divide a plural number of semiconductor devices formed on single wafer into individual semiconductor devices, the recess being formed by etching to a desired depth of the wafer, the recess functioning as a guide for a dicing saw, the method comprising the steps of:

A) forming the plural number of semiconductor devices and a protection layer for the semiconductor devices thereon, B) forming a resist pattern with a resist layer on the protection layer, C) forming openings for the recess by carrying out isotropic etching so that an etching edge reaches to a depth before the desired depth in the wafer, D) transforming the resist pattern so as to cover side walls of the openings for the recess with the resist layer, and further E) carrying out further isotropic etching to the desired depth in the wafer.

A method for dividing a plural number of semiconductor devices formed on single wafer into individual semiconductor devices utilizing a dicing saw, the plural number of semiconductor devices being sectioned at a scribing recess formed to a desired depth, the wafer being cut by the dicing saw utilizing the recess as a guide, the method comprising the steps of:

A) forming the plural number of semiconductor devices and a protection layer for the semiconductor devices thereon, B) forming a resist pattern with a resist layer on the protection layer, C) forming openings for the recess by carrying out isotropic etching so that an etching edge reaches to a depth before the desired depth, D) transforming the resist pattern so as to cover side walls of the openings for the recess with the resist layer, E) carrying out isotropic etching to the desired depth, and cutting the wafer along the recess.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 2A and FIG. 2B are cross-sectional views of process flow illustrating a preprocess in a method for dividing semiconductor devices in the present invention.

DESCRIPTION OF THE PREFERRED EMBODIMENT

Figure 1A:
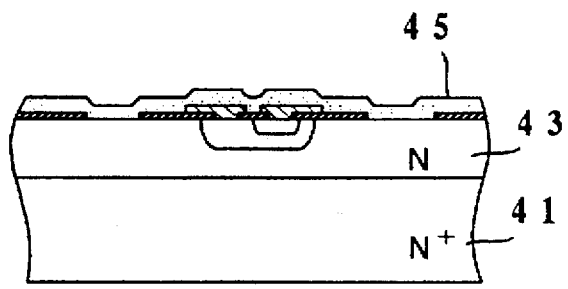
FIG. 1A, FIG. 1B, FIG. 1C, and FIG. 1D are cross-sectional views of process flow illustrating a method for dividing semiconductor devices in the prior art.
Figure 1B:
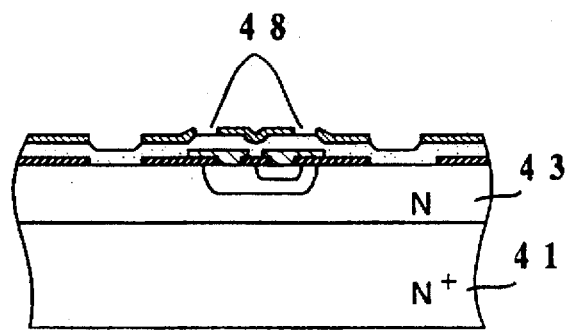
Figure 1C:
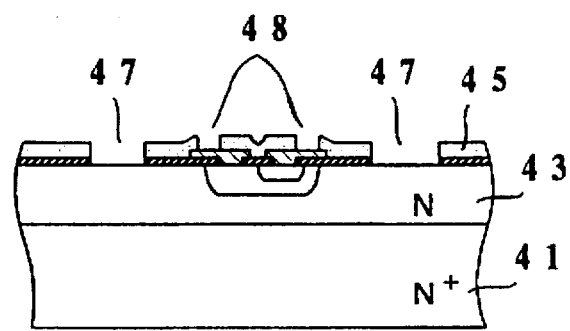
Figure 1D:
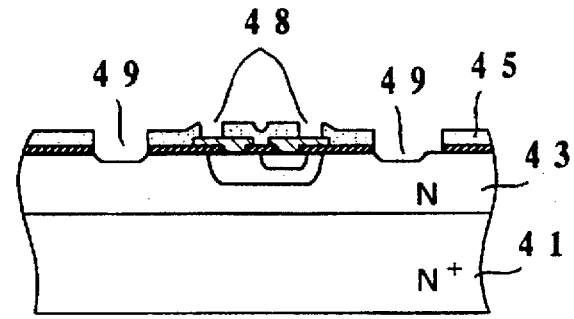

An embodiment of the present invention is explained with reference to the figures. FIG. 2A shows that a plural number of semiconductor devices α, β and γ are formed and that a protection layer is formed on these semiconductor devices. In detail, N type epitaxial layer 4 is formed in N+ type silicon wafer 2. Then, P type base region 6 is formed in the N type epitaxial layer 4, and thereafter, N type emitter region 8 is formed in the P type base region 6. The surface of the N type epitaxial layer 4 is covered with a silicon oxide layer 11, and then openings are formed on the N type epitaxial layer 4. Aluminum electrode 16 for the base region 6 and aluminum electrode 18 for the N type emitter 8 are formed. Thereafter, the surface of the N type epitaxial layer 4 is covered with a passivation layer 15 as a protection layer. Thus, the semiconductor devices α, β and γ and the protection layer for those devices is formed.

In this embodiment, the silicon wafer 2 in which the N type epitaxial layer 4 is formed is referred to as a wafer.

On completion of the forming of the semiconductor devices and the passivation layer 15, resist layer 31a, 31b, 31c, 32, 33, 34, 35a, 35b and 35c is formed on the passivation layer 15 as shown in FIG. 2B. The resist layer 31a, 31b, 31c, 32, 33, 34, 35a, 35b and 35c is the layer which forms openings 26 and 28 for bonding and forms openings 24 and 25 for scribing lines to divide semiconductor devices α, β and γ into individual devices.

Figure 3A:
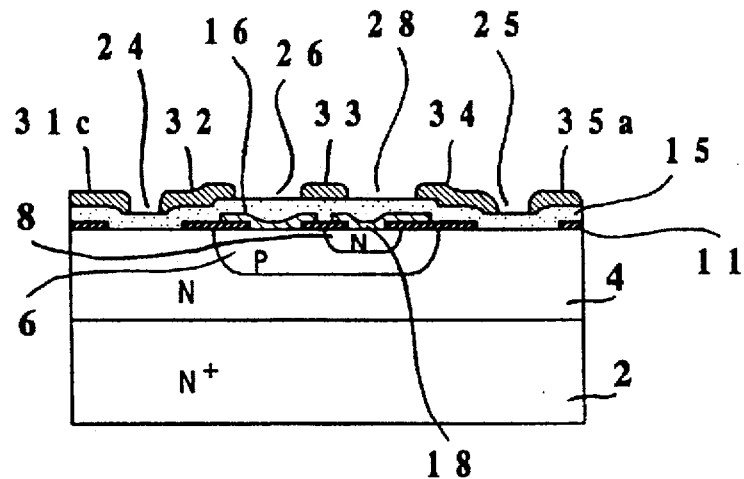
FIG. 3A, FIG. 3B and FIG. 3C are cross-sectional views of process flow illustrating a method for dividing semiconductor devices in the present invention.
Figure 3B:
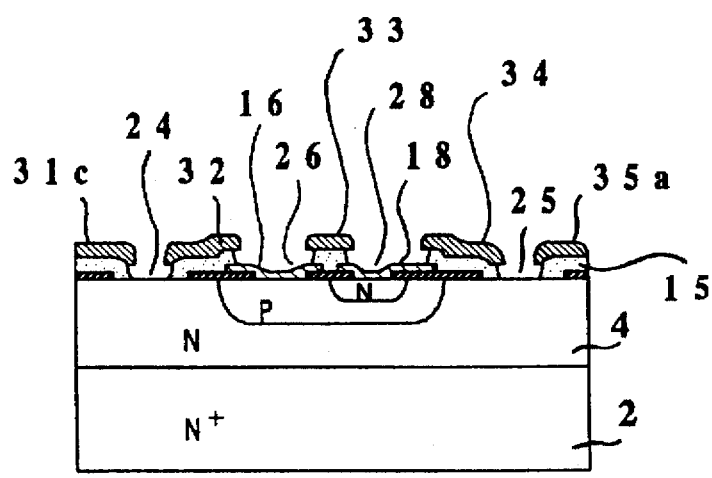

FIG. 3A shows an enlarged view of the vicinity of the semiconductor device β shown in FIG. 2B. Upon completion of the process shown in FIG. 3A, isotropic etching is carried out by utilizing the resist layer 31c, 32, 33, 34 and 35a as a mask. In this embodiment, the etchant is $CF_4$, $O_2$ gas. The passivation layer 15 is etched, and the surface of the N type epitaxial layer 4 is exposed as shown in FIG. 3B. Since the etching is isotropic, the resist layer 31c, 32, 33, 34 and 35a is etched in an overhang shape as shown in FIG. 3B.

On completion of the isotropic etching as shown in FIG. 3B, heat treatment is accomplished using a hot plate. In this embodiment, with a negative resist layer thickness of 4 μm, the heat treatment is carried out at 220° C. for 3 minutes. The resist layer 31c, 32, 33, 34 and 35a is transformed during the heat treatment, so that, side walls of the passivation layer 15 are covered with the resist layer 31c, 32, 33, 34 and 35c as shown in FIG. 3C.

Heat can preferably be applied within a range of temperature from 180° C. to 220° C., with a temperature range from 190° C. to 210° C. being more preferable. The temperature is determined depending on damage to the resist layer 31c, 32, 33, 34 and 35a during the processes carried out prior to the heat treatment. When the resist layers are relatively undamaged, the temperature of the heat treatment can be set at a lower temperature within the above mentioned temperature range. On the other hand, when the resist layers are relatively quite damaged, the temperature of the heat treatment should be set at a higher temperature within the above mentioned temperature range. The reason to do the heat treatment for 3 minutes is as follows. Since the resist layer 31c, 32, 33, 34 and 35a is transformed during a certain period of time, it is necessary to consider a time lag for covering the side walls with the transformed resist.

Although in this embodiment, negative resist is utilized to form the resist layers, it is also possible to use positive resist for the resist layer.

Figure 3C:
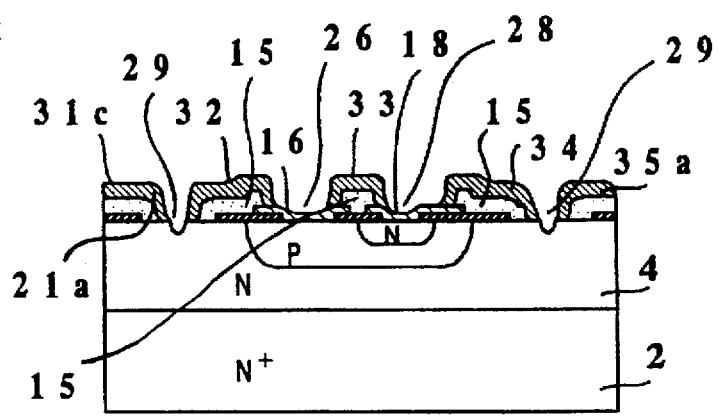

On completion of the heat treatment as shown in FIG. 3C, plasma etching utilizing $CF_4$, $O_2$ gas is done again. With this plasma etching, the N type epitaxial layer 4 of the openings 24 and 25 is etched. During the etching, the side walls of the passivation layer 15 of the openings 24 and 25 are covered with the resist layer 31c, 32, 34 and 35a. Because of the covering, the passivation layer 15 is not etched in the horizontal direction at the openings 24 and 25. Therefore, only the N type epitaxial layer 4 is etched and scribing trench 29 as a recess for scribing is formed as a result.

As indicated, the side walls of the passivation layer 15 at openings 26 and 28 are covered with the resist layer 32, 33 and 34, and etching is not carried out in the horizontal direction. Further, with plasma etching utilizing $CF_4$, $O_2$ gas, the aluminum electrodes of the openings 26 and 28 are not etched. Therefore, in the openings 26 and 28, there is no etching in either the horizontal or the vertical direction against the surface of the wafer.

The wafer is cut by the dicing blade. As a result, the semiconductor devices α, β and γ are divided into individual semiconductor devices.

As described above, in this embodiment, the scribing trench 29 is formed by doing the following processes. First, isotropic etching is carried out until the etching edge reaches to a depth just before the desired depth of the wafer. Then, the resist layer 31c, 32, 33, 34 and 35a is heat treated so that the side walls of the openings 24 and 25 of the scribing line are covered with the resist layer. Thereafter, isotropic etching is carried out until the etching edge reaches to the desired depth of the wafer. That is, since the above described method is able to prevent etching to the openings 24 and 25 in the horizontal direction, it is possible to carry out isotropic etching to secure depth of etching without widening the width of the scribing trench. Only the epitaxial layer 4 is etched and not the passivation layer 15. It is not necessary to widen the width of the scribing trench 29, since the width of the scribing trench 29 is equivalent to the required width to carry out dicing. Thus, the number of semiconductor chips manufactured per wafer can be increased. Also, the cause of chipping can be prevented by forming a scribing trench 29.

Further, chipping can prevented more certainly by etching the scribing trench 29 almost to the same depth or a deeper depth than the diameter of grit of diamond contained in the dicing blade.

The reason why chipping can be prevented by forming the scribing trench 29 as described above is as follows. Generally, chipping is caused in the vicinity of the wafer surface by the grit of diamond contained in the dicing blade when the dicing blade is contacting the wafer. It is possible to prevent chipping outside of the scribing trench by etching deeper than the grit of diamond (hereinafter referred as diamond grit) prior to cutting the wafer. Further, since the diameter of the diamonds contained in the cutting blade is not uniform it is preferable prior to cutting the wafer to carry out etching to almost the same depth or a deeper of the diameter of largest diamond grit contained in the dicing blade.

It is possible to prevent forming the passivation layer 15 in an overhang shape as well as to prevent chipping. If the scribing trench 29 is formed more deeply than required, there is a possibility that the passivation layer 15 will be formed in an overhang shape, because the etching to the epitaxial layer 4 is isotropic etching. Therefore, it is possible to prevent forming the passivation layer 15 in an overhang shape and to prevent the cause of chipping by etching almost the same depth or a deeper depth than the largest diameter of diamond grit contained in the dicing blade prior to cutting the wafer. In this embodiment, it is assumed that the diameter of diamond grit is form 4 μm to 6 μm, and the thickness of the resist layers are 4 μm. Then, the depth of etching for the N type epitaxial layer 4 in the openings 24 and 25 is set at 6 μm.

If the diameter of the diamond grid in the dicing blade is from 4 μm to 8 μm, the depth of etching to the wafer may be 8 μm.

As indicated, it is possible to provide a method for dividing semiconductor devices which is able to protect side walls of openings from etching which prevents the cause of chipping. Further, as described above, it is possible to prevent chipping more certainly by forming the depth of the scribing trench to a depth of almost the same depth or a deeper depth than that diameter of the largest diamond grit contained in the dicing blade which is used for dividing each semiconductor device.

Further, in this embodiment, the present invention is applied when a plural number of bipolar transistors are formed on a single piece of wafer. In addition to forming bipolar transistors, the present invention is applicable to form other kinds of semiconductor devices such as diodes, MOS transistors and Ga or As transistors.

Also, in the embodiment described above, the side walls of the passivation layer 15 are covered with resist layer 31C to 35a by carrying out heat treatment. However, the invention is not limited to using heat treatment, other processes which can transform the resist layers to cover the side walls of the scribing trench can also be used.

In this embodiment, since the etching rate of silicon is higher than the rate of the passivation layer 15, the etching speed of the epitaxial layer 15 in the horizontal direction is faster than the rate in the vertical direction. Therefore, the passivation layer 15 is formed in an overhang shape by nature. To prevent forming the passivation layer 15 in that shape, heat treatment to the resist layer is carried out to transform the resist layer so that the side walls of the openings 24 and 25 of the scribing line are covered with the resist layer 31c, 32, 33, 34 and 35a. Thereafter, the scribing trench 29 is formed by carrying out the isotropic etching to obtain the desired depth in the wafer. However, it is not limited to use for above described layers for covering the side walls, the present invention is applicable to other layers which have a relationship wherein the etching rate of the wafer is higher than the etching rate of the protection layer, and the etching speed of the wafer in the horizontal direction is faster than that of the protection layer.

In the method for dividing semiconductor devices of the present invention, isotropic etching is carried out until the etching edge reaches to a depth before the desired depth for forming the openings for the scribing trench. Then, the shape of the resist layers are transformed so as to cover the side walls of the openings for the scribing trench. Thereafter, the scribing trench is formed by carrying out isotropic etching until the desired depth is reached. Thus, it is possible to protect the side walls from etching by carrying out isotropic etching to the desired depth by covering the side wall of the openings for the scribing trench with the resist layers. Therefore, it is possible to prevent forming the protection layer in overhang shape. That is, even though isotropic etching is carried out, the number of chips manufactured per wafer can be increased without adding many processes.

In the method for dividing semiconductor devices of the present invention, transformation of the shape of the resist layers is carried out by the heat treatment. That is, it is possible to transform the shape of the resist layers so as to cover the side walls of the openings by carrying out heat treatment once. In this way, the side walls can be protected easily from etching.

Also, in the method for dividing semiconductor devices of the present invention, isotropic etching carried out to a depth before the desired depth is performed until a surface of the wafer is exposed by carrying out etching through the protection layer. Upon completion of etching of the protection layer, heat treatment is carried out to the resist layer for covering the side walls of the protection layer. Therefore, although isotropic etching is carried out, it is possible to prevent forming the protection layer in an overhang shape. That is, even though isotropic etching is carried out, the number of semiconductor devices manufactured per wafer can be increased without adding many processes.

Although the invention has been described in its preferred form with a certain degree of particularly, it is understood that the present disclosure of the preferred form has other combinations and arrangements of steps that may be resorted to without departing from the spirit and the scope of the invention as hereinafter claimed.

What is claimed is:

1. A method for forming a scribing recess to divide a plural number of semiconductor devices formed on a single wafer into individual semiconductor devices, the recess being formed by etching to a desired depth in the wafer, the recess functioning as a guide for a dicing saw, the method comprising the steps of:

A) forming the plural number of semiconductor devices on the wafer and a protection layer for the semiconductor devices thereon, B) forming a resist pattern with a resist layer on the protection layer, C) forming at least one opening for the scribing recess by carrying out isotropic etching so that an etching edge at least partially reaches through the protection layer to a depth before the desired depth in the wafer, D) transforming the resist pattern with heat treatment so as to cover side walls of each opening for the scribing recess with the resist layer and, E) carrying out further isotropic etching to the desired depth in the wafer.

2. A method for forming a scribing recess to divide semiconductor devices in accordance with claim 1, wherein the resist pattern is additionally used for forming openings for bonding, and the openings for bonding are formed during the step of forming the openings for the scribing recess.

3. A method for forming a scribing recess to divide semiconductor devices in accordance with claim 2, wherein a surface of the wafer is exposed as a result of carrying out the isotropic etching of step C) through the protection layer until the etching edge reaches to the depth before the desired depth.

4. A method for forming a scribing recess to divide semiconductor devices in accordance with claim 3, wherein the isotropic etching of steps C) and E) is performed as plasma etching by utilizing $CF_4$, $O_2$ gas.

5. A method for forming a scribing recess to divide semiconductor devices in accordance with claim 4, wherein the wafer is cut along the scribing recess with a dicing saw having a dicing blade and the desired depth in the wafer is more than a diameter of the largest grit of diamond contained in the dicing blade.

6. A method for forming a scribing recess to divide semiconductor devices in accordance with claim 5, wherein the desired depth is from 4 µm to 8 µm.

7. A method for forming a scribing recess to divide semiconductor devices in accordance with claim 1, wherein the heat treatment is carried out at approximately from 180° C. to 220° C.

8. A method for dividing a plural number of semiconductor devices formed on a single wafer into individual semiconductor devices utilizing a dicing saw, the plural number of semiconductor devices being sectioned at a scribing recess formed to a desired depth in the wafer, the wafer being cut by the dicing saw utilizing the recess as a guide, the method comprising the steps of:

A) forming the plural number of semiconductor devices on the wafer and a protection layer for the semiconductor devices thereon, B) forming a resist pattern with a resist layer on the protection layer, C) forming at least one opening for the scribing recess by carrying out isotropic etching so that an etching edge at least partially reaches through the protection layer to a depth before the desired depth in the wafer, D) transforming the resist pattern with heat treatment so as to cover side walls of each opening for the scribing recess with the resist layer, E) carrying out further isotropic etching to the desired depth in the wafer, and F) cutting the wafer along the scribing recess.

9. A method for dividing the plural number of semiconductor devices into individual semiconductor devices in accordance with claim 8, wherein the resist pattern is additionally used for forming openings for bonding, and the openings for bonding are formed during the step of forming the openings for the scribing recess.

10. A method for dividing the plural number of semiconductor devices into individual semiconductor devices in accordance with claim 9, wherein a surface of the wafer is exposed as a result of carrying out the isotropic etching of step C) through the protection layer until the etching edge reaches to the depth before the desired depth in the wafer.

11. A method for dividing the plural number of semiconductor devices into individual semiconductor devices in accordance with claim 9, wherein the isotropic etching of steps C) and E) is performed as plasma etching by utilizing $CF_4$, $O_2$ gas.

12. A method for dividing the plural number of semiconductor devices into individual semiconductor devices in accordance with claim 11, wherein the desired depth in the wafer is more than a diameter of the largest grit of diamond contained in a dicing blade of the dicing saw.

13. A method for dividing the plural number of semiconductor devices into individual semiconductor devices in accordance with claim 12, wherein the desired depth in the wafer is from 4 μm to 8 μm.

14. A method for dividing the plural number of semiconductor devices into individual semiconductor devices in accordance with claim 8, wherein the heat treatment is carried out at approximately from 180° C. to 220° C.

* * * * *